United States Patent
Jeong (10) Patent No.: US 7,336,559 B2
(45) Date of Patent: Feb. 26, 2008

(54) DELAY-LOCKED LOOP, INTEGRATED CIRCUIT HAVING THE SAME, AND METHOD OF DRIVING THE SAME

(75) Inventor: Byung-Hoon Jeong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/730,793

(22) Filed: Apr. 4, 2007

(65) Prior Publication Data

US 2007/0195638 A1    Aug. 23, 2007

Related U.S. Application Data

(63) Continuation-in-part of application No. 11/000,940, filed on Dec. 2, 2004, now Pat. No. 7,215,596.

(30) Foreign Application Priority Data

Dec. 4, 2003    (KR) ............................... 2003-96385

(51) Int. Cl.
    *G11C 8/00* (2006.01)
    *G11C 8/18* (2006.01)
    *H03L 7/06* (2006.01)
    *H03K 7/08* (2006.01)

(52) U.S. Cl. ............. 365/233; 365/230.08; 365/233.5; 327/147; 327/149; 327/156; 327/175

(58) Field of Classification Search ............... 365/233, 365/233.5; 327/156, 175, 147, 149
See application file for complete search history.

(56) References Cited

U.S. PATENT DOCUMENTS 5,708,395 A * 1/1998 Yamauchi et al. .......... 331/1 A
6,069,507 A 5/2000 Shen et al.
6,141,671 A * 10/2000 Adams et al. .............. 708/313
6,373,413 B1 * 4/2002 Yoshinaka ................... 341/94
6,392,458 B1 5/2002 Miller, Jr. et al.
6,404,248 B1 6/2002 Yoneda
6,542,609 B1 4/2003 Ryan et al.
2002/0003747 A1 1/2002 Yahata et al.
2002/0084818 A1 7/2002 Cho
2003/0219088 A1 11/2003 Kwak
2004/0041609 A1 3/2004 Lin
2005/0093597 A1 * 5/2005 Kwak ......................... 327/158

FOREIGN PATENT DOCUMENTS

JP         6188740 A      7/1994

* cited by examiner

*Primary Examiner*—Lý Duy Pham
(74) *Attorney, Agent, or Firm*—Volentine & Whitt, PLLC (57) ABSTRACT

A delay-locked loop (DLL) is disclosed with a phase detector configured to detect a phase difference between an external clock signal and an internal clock signal, a variable delay line configured to variably delay the external clock signal in relation to the phase difference to generate an intermediate clock signal, a selection unit configured to select between the intermediate clock signal and an inverted version of the intermediate clock signal in relation to an inversion control signal, and to generate an internal clock signal according to the selection, and an inversion determination unit configured to generate the inversion control signal in relation to transition of the external clock signal within a duty error margin.

20 Claims, 7 Drawing Sheets

DELAY-LOCKED LOOP, INTEGRATED CIRCUIT HAVING THE SAME, AND METHOD OF DRIVING THE SAME

CROSS-REFERENCE TO RELATED APPLICATIONS

This application is a continuation-in-part of U.S. patent application Ser. No. 11/000,940, filed on Dec. 2, 2004 now U.S. Pat. No. 7,215,596, which claims priority to Korean patent application number 2003-96385 filed Dec. 24, 2003. The subject matter of both of these applications is hereby incorporated by reference.

BACKGROUND OF THE INVENTION

1. Field of the Invention

The present invention relates to a delay-locked loop (DLL), and more particularly to a DLL, an integrated circuit (IC) incorporating a DLL, and a method of driving a DLL capable of reliable operation in spite of an incident duty error.

2. Description of the Related Art

Contemporary electronic and telecommunications equipment require very precise transmission of various signals in order to operate properly. Hence, it is critical to accurately reproduce the timing characteristics of the signals in order to ensure their proper transmission and reception. That is, the signals must typically be synchronized in their transmission and reception with a standard or reference timing signal (e.g., a clock reference signal). The phase-locked loop (PLL) and the delay-locked loop (DLL) are circuits commonly used to synchronize the timing characteristics between signals.

The conventional PLL generates a voltage control signal corresponding to a phase difference between an external clock signal and a reproduction clock signal. The phase of the reproduction clock signal is adjusted in relation to the voltage control signal to follow the phase of the external clock signal by means of varying the frequency of the reproduction clock signal.

The conventional DLL similarly generates a voltage control signal corresponding to a phase difference between the external clock signal and the reproduction clock signal, but adjusts a delay period for the reproduction clock signal in response to the voltage control signal to thereby control the phase of the reproduction clock signal such that it follows the phase of the external clock signal.

A DLL is commonly used in digital signal processing systems and synchronous memory devices, such as Dynamic Random Access Memory (DRAM). Common DLL configurations use an inversion scheme that provides a fast locking of signals at the beginning of a phase locking operation.

Figure 1:
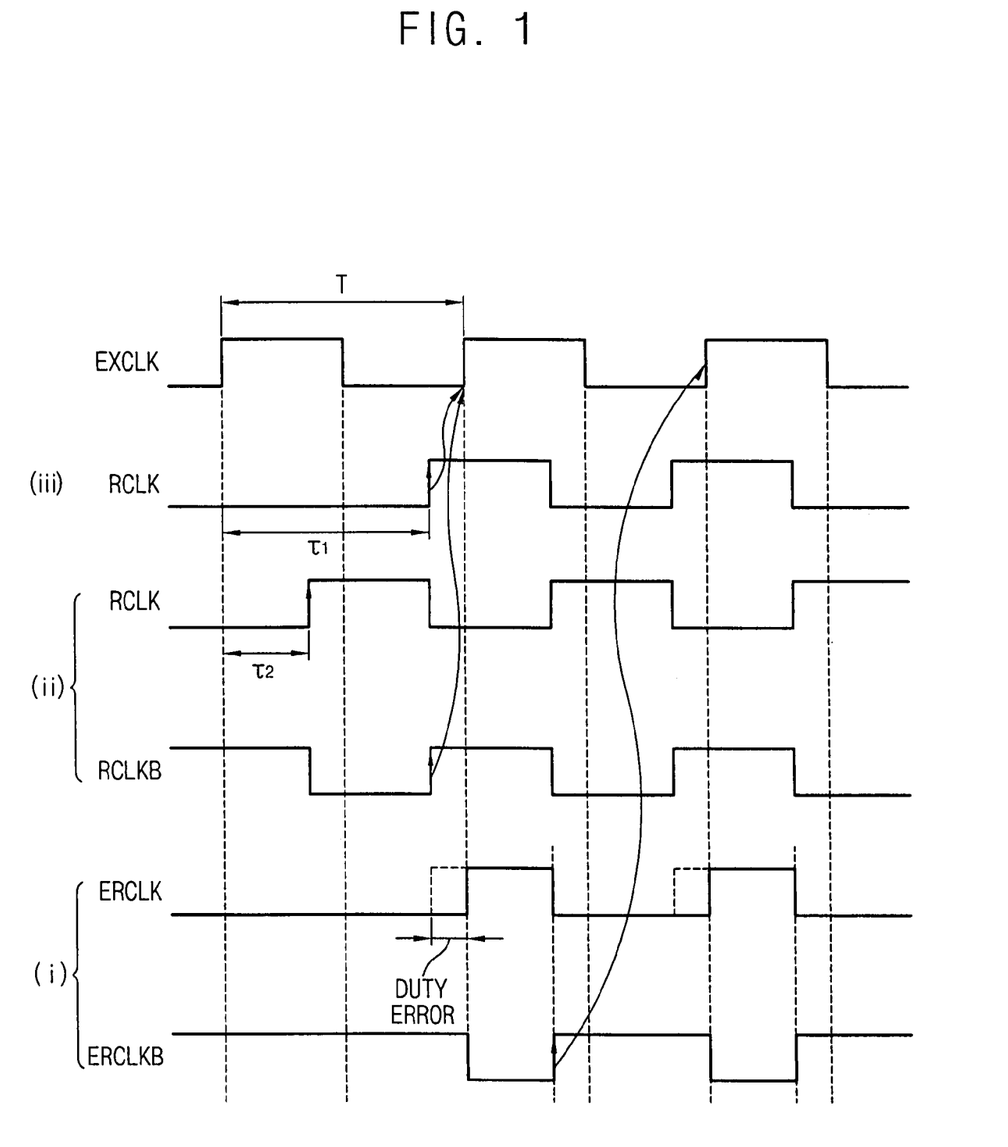
FIG. 1 is a timing diagram showing an inversion scheme and an error caused by a duty error in a conventional delay-locked loop (DLL).

Referring to Figure (FIG.) 1, a typical inversion scheme, as implemented in a DLL circuit, compares the phase of a received external clock signal (EXCLK) with the phase of a reproduction clock signal (RCLK) in order to generate (i.e., "output") the received external clock signal RCLK without inversion when the phase difference, $\tau 1$, between the clock signals EXCLK and RCLK is greater than one half of a cycle, (i.e., $T/2(\tau 1 > T/2)$ ). (See timing relationship (iii) in FIG. 1). In contrast, an inverted reproduction clock signal (RCLKB) is output when the phase difference, $\tau 2$, is less than one half of a cycle (i.e., $T/2(\tau 2 < T/2)$ ). (See timing relationship (ii) in FIG. 1). Within the foregoing timing relationships, the "following time" (i.e., a delay time) required to lock the rising edge of RCLK to the rising edge of EXCLK can be reduced to no more than half a clock cycle.

However, this is not the case where the duty cycle ratio of RCLK falls below 50%. (See timing relationship (i) in FIG. 1). In such cases, the reproduction clock signal ERCLK must be delayed by more than half a cycle when inversion is performed because otherwise the phase difference during the next cycle would be mistakenly seen as being less than a half cycle despite the phase difference actually being more than a half cycle.

Thus, a DLL implementing the foregoing inversion scheme experiences a problem in that the initial locking time is additionally delayed by as much as the change in the duty ratio of the reproduction clock signal RCLK. Operating speed suffers accordingly when one cycle of the clock signal is larger than a predetermined maximum delay period, and phase unlocking may occur because an appropriate locking delay adjustment cannot be performed for such delay periods.

SUMMARY OF THE INVENTION

Embodiments of the present invention provided a delay-locked loop (DLL) capable accurate operation despite an incident duty error in the received signal. Embodiments of the invention also provide an integrated circuit (IC) including such a DLL and a corresponding method of driving the DLL.

In one embodiment, the invention provides a delay-locked loop (DLL), comprising; a phase detector configured to detect a phase difference between an external clock signal and an internal clock signal, a variable delay line configured to variably delay the external clock signal in relation to the phase difference to generate an intermediate clock signal, a selection unit configured to select between the intermediate clock signal and an inverted version of the intermediate clock signal in relation to an inversion control signal, and to generate an internal clock signal according to the selection, and an inversion determination unit configured to generate the inversion control signal in relation to transition of the external clock signal within a duty error margin.

In a related embodiment, the duty error margin may correspond to a specific range of the internal clock signal, and more specifically to a range between the leading edge of the internal clock signal and the leading edge of a delayed version of the internal clock signal. Alternately, the specific range may correspond to a range between the leading edge of the internal clock signal and a defined point between the leading edge and the trailing edge of the internal clock signal, wherein the defined point between the leading and trailing edges of the internal clock signal is generated by delaying a start signal.

In a related embodiment, the inversion determination unit may comprise; a first latch circuit configured to latch the external clock signal on the leading edge of the internal clock signal to output a first level detection signal, a second latch circuit configured to latch the external clock signal on the leading edge of a delayed internal clock signal to output a second level detection signal, and a third latch circuit configured to latch an inversion decision signal on the leading edge of a start signal to output the inversion control signal, wherein the inversion decision signal is generated by a logical AND operation between the first level detection signal and the second level detection signal.

Alternately, the inversion determination unit may comprise; a first latch circuit configured to latch the external clock signal on the leading edge of the internal clock signal to output a level detection signal, a second latch circuit configured to latch the level detection signal on the leading edge of the start signal to output a first inversion decision signal, and a third latch circuit configured to latch the level detection signal on the leading edge of a reproduction clock signal to output a second inversion decision signal, wherein the reproduction clock signal is generated by a logical AND operation between the internal clock and the delayed start signal, wherein the inversion control signal is generated by a logical AND operation between the first inversion decision signal and the second inversion decision signal.

DESCRIPTION OF THE EMBODIMENTS

Embodiments of the present invention now will be described more fully with reference to the accompanying drawings. The present invention may, however, be embodied in many different forms and should not be construed as limited to only the embodiments set forth herein. Rather, these embodiments are presented as teaching examples. Throughout the drawings and written description, like reference numerals refer to like or similar elements.

It will be understood that, although the terms first, second, etc. may be used herein to describe various elements, these elements should not be limited by these terms. These terms are merely used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
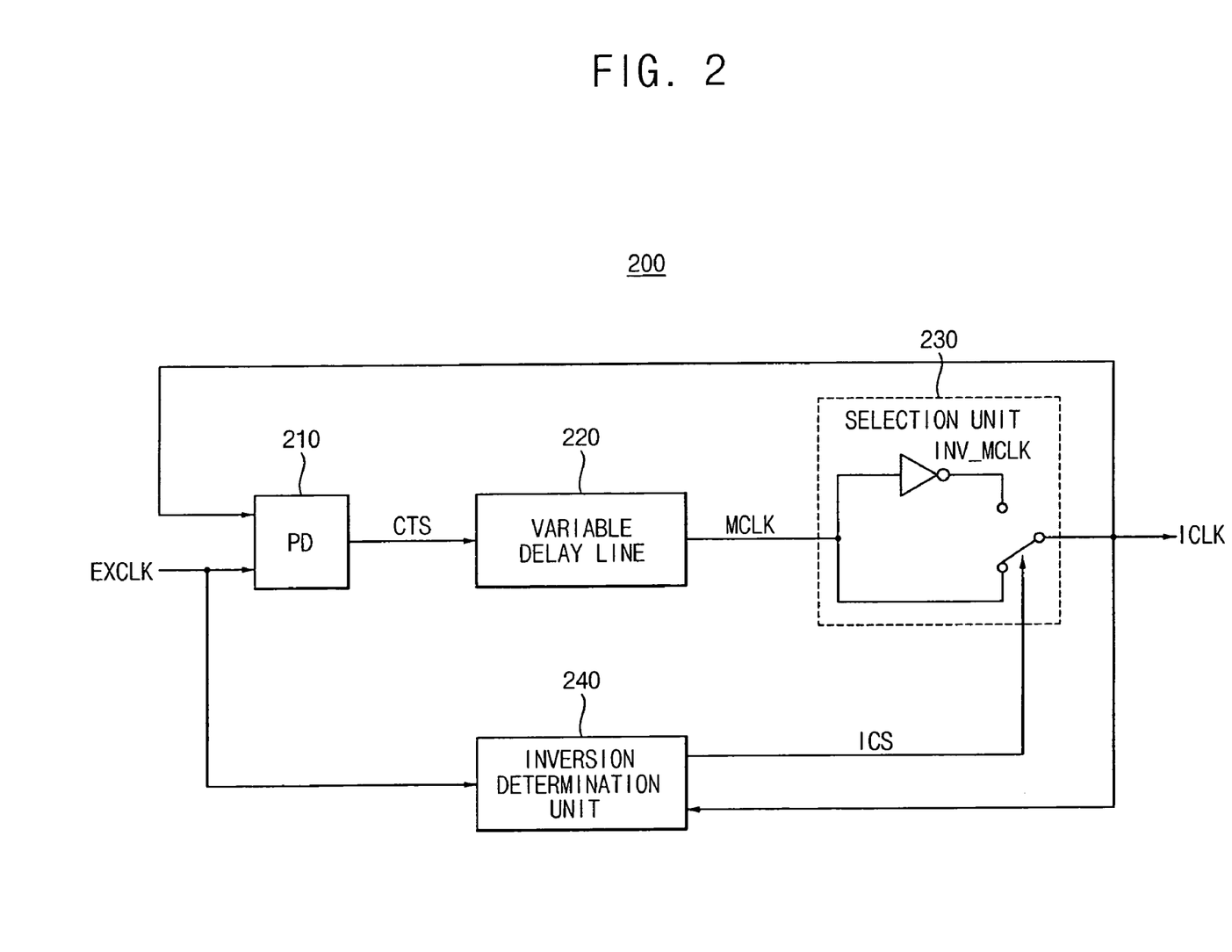
FIG. 2 is a block diagram illustrating a DLL according to an example embodiment of the present invention.

FIG. 2 is a block diagram illustrating a delay-locked loop (DLL) according to an embodiment of the invention.

Referring to FIG. 2, a DLL 200 includes a phase detector 210, a variable delay line 220, a selection unit 230 and an inversion determination unit 240.

In the illustrated embodiment, phase detector 210 detects a phase difference between an external clock signal EXCLK and an internal clock signal ICLK. For example, when the phase of the external clock signal EXCLK is faster or slower than that of the internal clock signal ICLK, phase detector 210 outputs a control signal CTS indicative of that phase difference.

Variable delay line 220 delays the external clock signal EXCLK based on the phase difference provided by phase detector 210 in order to generate an intermediate clock signal MCLK. In one embodiment, variable delay line 220 is implemented as a plurality of delay cells each having a delay interval controlled by the control signal CTS. Alternately, variable delay line 220 may be implemented as a plurality of sequentially coupled delay cells along with twin multiplexers and an interpolator.

Selection unit 230 selects between the intermediate clock signal MCLK and an inverted version of the intermediate clock signal INV_MCLK in response to an inversion control signal ICS provide by inversion determination unit 240. The selected thereafter signal serves as an internal clock signal ICLK.

Inversion determination unit 240 generates the inversion control signal ICS based on a transition of the external clock signal EXCLK within a duty error margin. For example, the duty error margin may correspond to a specific range for the internal clock signal ICLK. A more detailed explanation of inversion determination unit 240 will be presented with reference to FIGS. 3 through 6.

Figure 3:
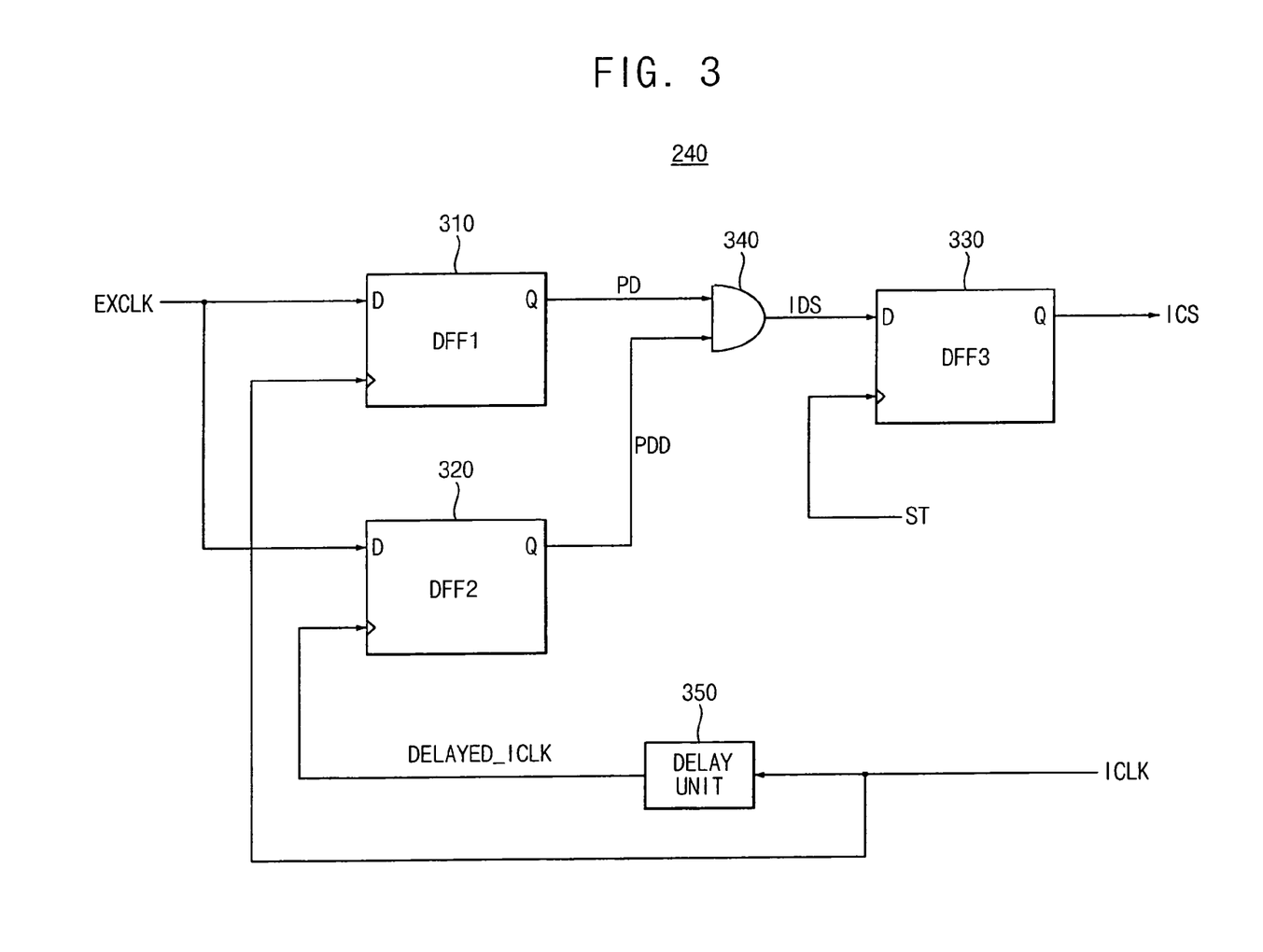
FIG. 3 is a block diagram illustrating one example embodiment of the inversion determination unit in FIG. 2.

FIG. 3 is a block diagram illustrating one possible embodiment of inversion determination unit 240 of FIG. 2. In this example, inversion determination unit 240 includes a first latch circuit 310, a second latch circuit 320, a third latch circuit 330, a logical AND gate 340 and a delay unit 350.

First delay circuit 310 latches the external clock signal EXCLK on the leading edge of the internal clock signal ICLK. This latched value is output as a first level detection signal PD.

Second latch circuit 320 latches the external clock signal EXCLK on the leading edge of a delayed internal clock signal DELAYED_ICLK to output a second level detection signal PDD. In one embodiment, the delayed internal clock signal DELAYED_ICLK is generated by delay unit 350 which delays the internal clock signal ICLK by a predetermined period.

Third latch circuit 330 latches an inversion decision signal IDS on the leading edge of a start signal ST. This latched value is output as the inversion control signal ICS. For example, the inversion decision signal IDS may be generated using a logical "AND" operation performed by logical AND gate 340 that receives both the first level detection signal PD and the second level detection signal PDD.

In one possible embodiment, each one of the first, second and third latch circuits 310, 320 and 330 may be implemented with a D flip-flop.

As described above, inversion determination unit 240 defines the duty error margin within a specific range between the leading edge of the internal clock signal ICLK and the leading edge of the delayed internal clock signal DELAYED_ICLK.

That is, inversion determination unit 240 delays the internal clock signal ICLK by the predetermined time and generates the inversion control signal ICS when the external clock signal EXCLK is transitioned between the leading edge of the internal clock signal ICLK and the leading edge of the delayed internal clock signal DELAYED_ICLK.

Figure 4:
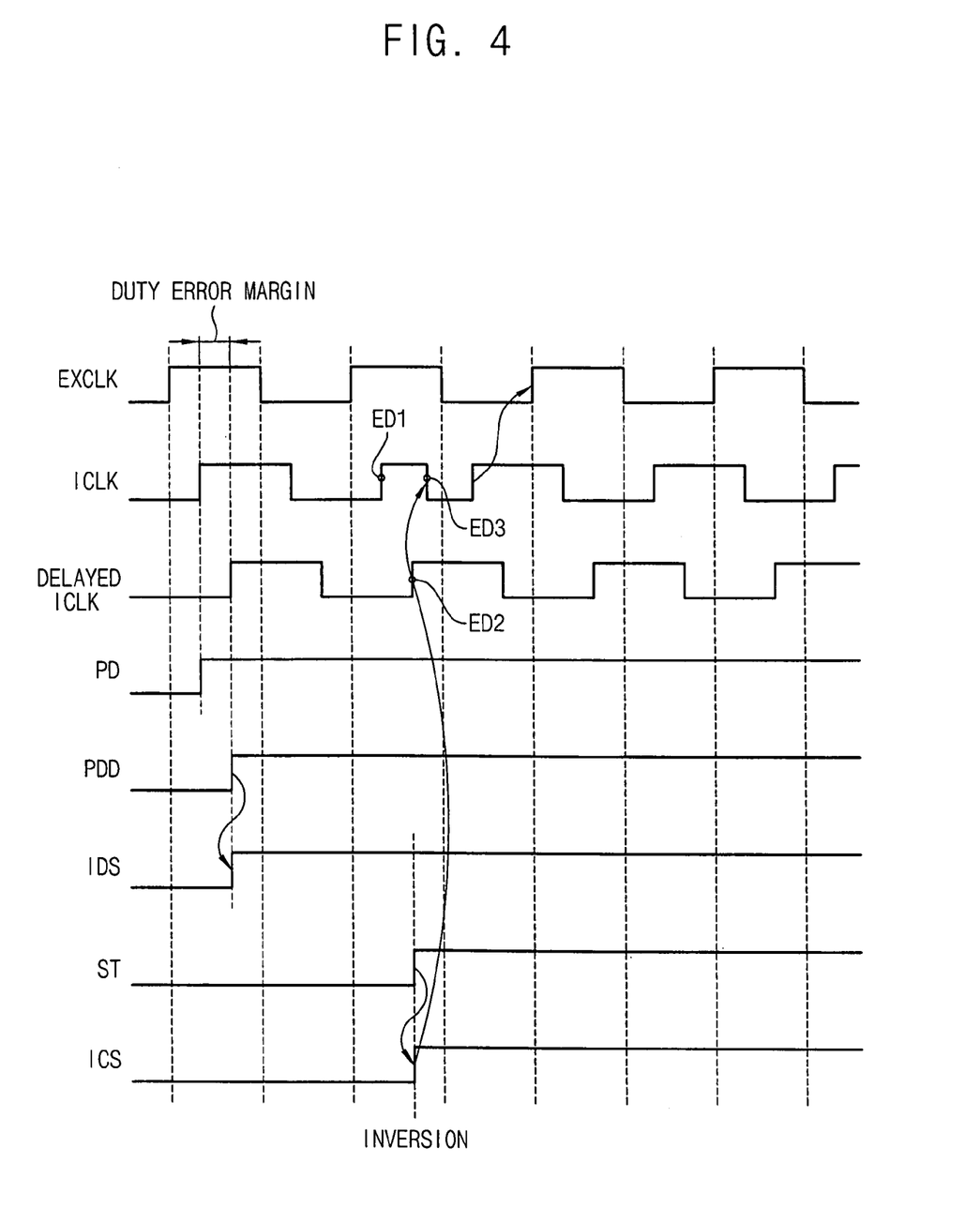
FIGS. 4 and 5 are timing diagrams illustrating operations of the inversion determination unit in FIG. 3.
Figure 5:
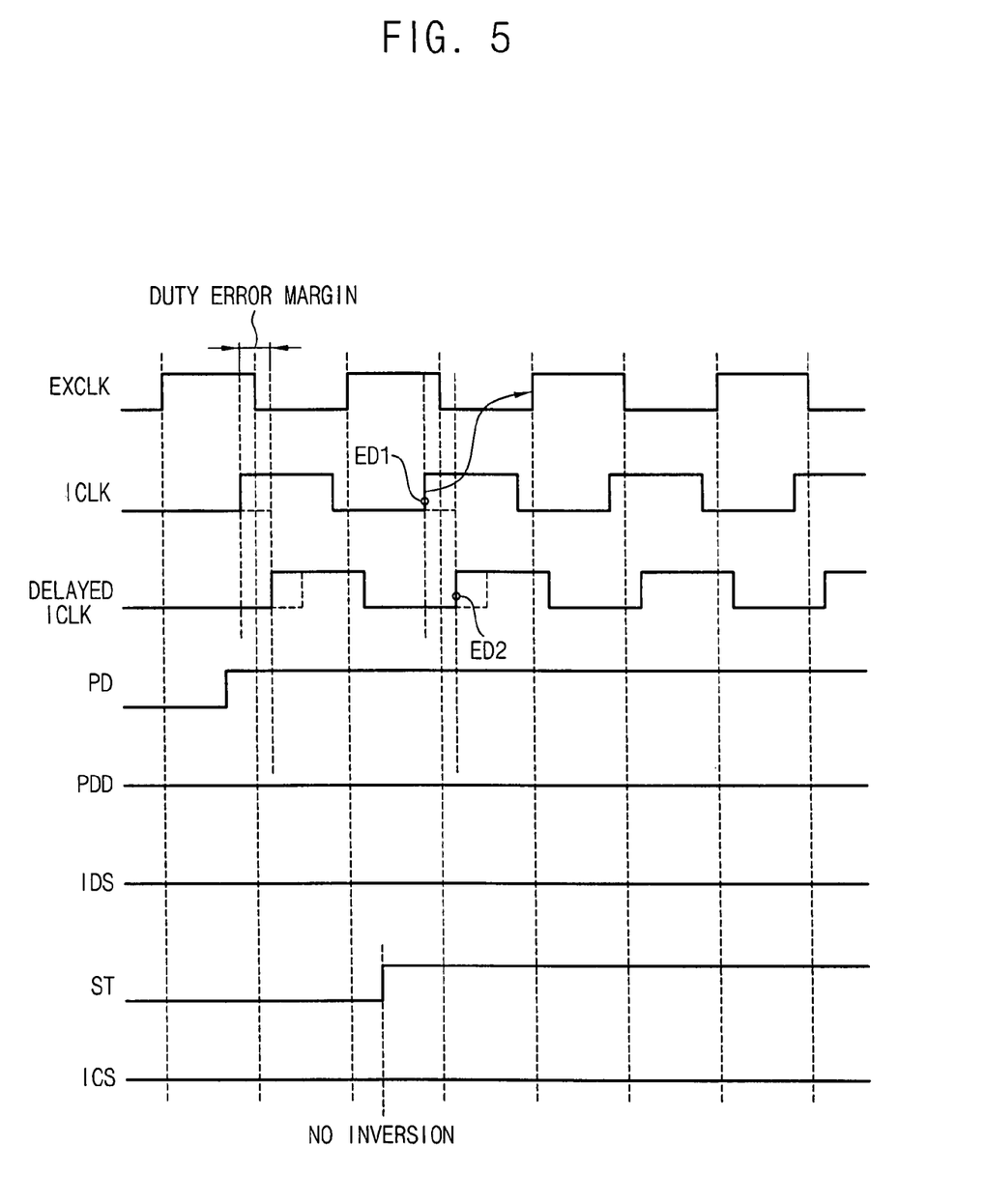

FIGS. 4 and 5 are related timing diagrams further illustrating the operation of inversion determination unit 240 of FIG. 3.

Inversion determination unit 240 receives the external clock signal EXCLK and the internal clock signal ICLK, and delays the internal clock signal ICLK to generate the delayed internal clock signal DELAYED_ICLK.

Inversion determination unit 240 then generates the first level detection signal PD on the rising edge of the internal clock signal ICLK and the second level detection signal PDD on the rising edge of the delayed internal clock signal DELAYED_ICLK.

In FIG. 4, the external clock signal EXCLK does not transition between the rising edge ED1 of the internal clock signal ICLK and the rising edge ED2 of the delayed internal clock signal DELAYED_ICLK. Therefore, inversion determination unit 240 generates the inversion control signal ICS in response to a start signal ST, and DLL 200 generates an inverted internal clock signal ED3.

In FIG. 5, however, the external clock signal EXCLK transitions between the rising edge ED1 of the internal clock signal and the rising edge ED2 of the delayed internal clock signal DELAYED_ICLK. Therefore, inversion determination unit 240 does not generate the inversion control signal ICS in response to the start signal ST, and DLL 200 does not generate an inverted internal clock signal.

Figure 6:
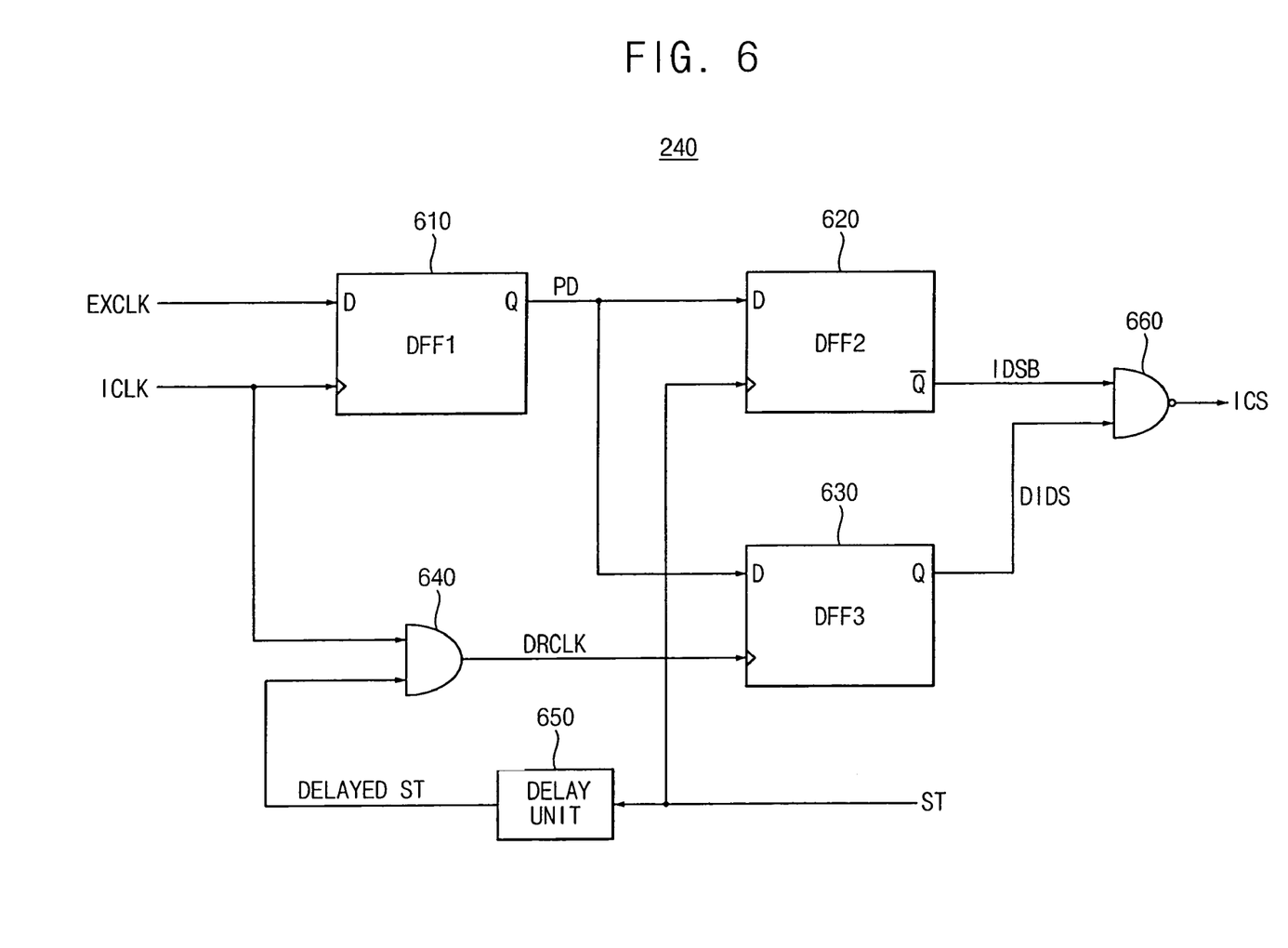
FIG. 6 is a block diagram illustrating another example embodiment of the inversion determination unit in FIG. 2.

FIG. 6 is a block diagram illustrating another possible embodiment of inversion determination unit 240 of FIG. 2.

Referring to FIG. 6, inversion determination unit 240 includes a first latch circuit 610, a second latch circuit 620, a third latch circuit 630, a logical AND gate 640, a delay unit 650 and a logical NAND gate 660.

Again, first latch circuit 610 latches the external clock signal EXCLK on the leading edge of the internal clock signal ICLK to output a level detection signal PD. However, second latch circuit 620 latches level detection signal PD on the leading edge of the start signal ST to output a first inversion decision signal IDSB.

Third latch circuit 630 latches the level detection signal PD on the leading edge of a reproduction clock signal DRCLK to output a second inversion decision signal DIDS. The reproduction clock signal DRCLK may be generated using a logical AND operation provided by logical AND gate 640 receiving the internal clock ICLK and the delayed start signal DELAYED_ST.

The inversion control signal ICS may be generated by performing a logical NAND operation using a logical NAND gate 660 receiving the first inversion decision signal IDSB and the second inversion decision signal DIDS.

Here again, each one of the first, second and third latch circuits 610, 620 and 630 may be implemented using a D flip-flop.

As described above in the form of two possible embodiments, inversion determination unit 240 may define the duty error margin as a specific range between the leading edge of the internal clock signal ICLK and a point between the leading edge and trailing edge of the internal clock signal ICLK, wherein this point is defined by a delayed version of the start signal ST.

That is, inversion determination unit 240 may be implemented to delay the start signal ST in order to generate the reproduction clock signal DRCLK at a point between the leading and trailing edges of the internal clock signal ICLK, and generate the inversion control signal ICS when the external clock signal EXCLK transitions between the leading edge of the internal clock signal ICLK and the defined point between the leading and trailing edges of the internal clock signal ICLK.

Figure 7:
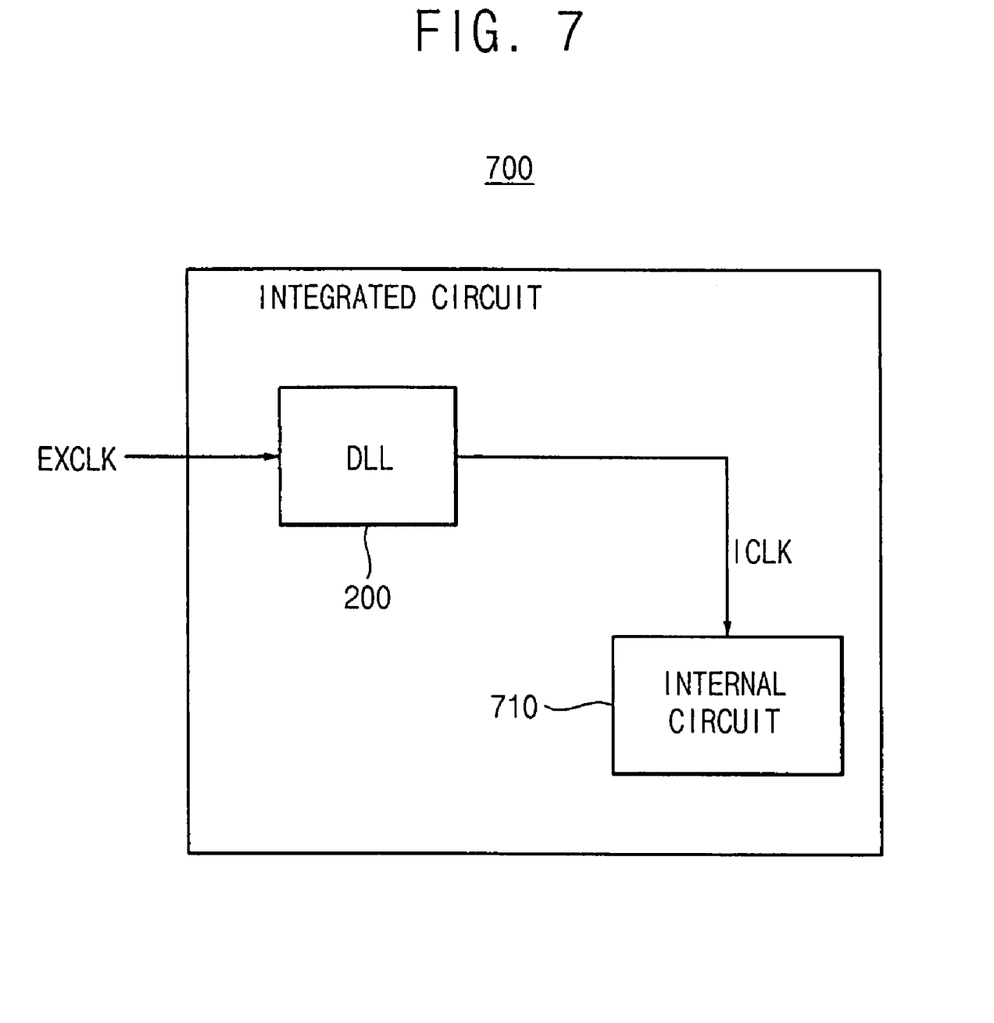
FIG. 7 is a block diagram illustrating an integrated circuit (IC) including a DLL in FIG. 2.

FIG. 7 is a block diagram illustrating an integrated circuit (IC) including a DLL in FIG. 2.

Referring to FIG. 7, an integrated circuit (IC) 700 includes a DLL 200 and an internal circuit 710. In one embodiment, internal circuit 710 may be a memory circuit, such as a dynamic random access memory (DRAM) or a static random access memory (SRAM). Alternately, the internal circuit may be a receiver, a transmitter, or transceiver.

Whatever the specific internal configuration of internal circuit 710, IC 700 receives the external clock signal EXCLK from another source (e.g., an external device or data channel). Before application of the external clock signal EXCLK, it is first passed through DLL 200 which, as noted above, is capable of accurate operation in spite of a duty error and may accurately perform an inversion operation to decrease an initial locking time.

While the embodiments of the invention have been described above, it should be understood that various changes, substitutions and alterations may be made to these embodiment without departing from the scope of the invention.

What is claimed is:

1. A delay-locked loop (DLL), comprising:
  a phase detector configured to detect a phase difference between an external clock signal and an internal clock signal;
  a variable delay line configured to variably delay the external clock signal in relation to the phase difference to generate an intermediate clock signal;
  a selection unit configured to select between the intermediate clock signal and an inverted version of the intermediate clock signal in relation to an inversion control signal, and to generate an internal clock signal according to the selection; and
  an inversion determination unit configured to generate the inversion control signal in relation to transition of the external clock signal within a duty error margin.

2. The DLL of claim 1, wherein the duty error margin corresponds to a specific range of the internal clock signal.

3. The DLL of claim 2, wherein the specific range corresponds to a range between the leading edge of the internal clock signal and the leading edge of a delayed version of the internal clock signal.

4. The DLL of claim 2, wherein the specific range corresponds to a range between the leading edge of the internal clock signal and a defined point between the leading edge and the trailing edge of the internal clock signal.

5. The DLL of claim 4, wherein the defined point between the leading and trailing edges of the internal clock signal is generated by delaying a start signal.

6. The DLL of claim 1, wherein the inversion determination unit delays the internal clock signal by a predetermined time and generates the inversion control signal when the external clock signal transitions between the leading edge of the internal clock signal and the leading edge of the delayed internal clock signal.

7. The DLL of claim 6, wherein the inversion determination unit comprises:
  a first latch circuit configured to latch the external clock signal on the leading edge of the internal clock signal to output a first level detection signal;

a second latch circuit configured to latch the external clock signal on the leading edge of a delayed internal clock signal to output a second level detection signal; and a third latch circuit configured to latch an inversion decision signal on the leading edge of a start signal to output the inversion control signal, wherein the inversion decision signal is generated by a logical AND operation between the first level detection signal and the second level detection signal.

8. The DLL of claim 1, wherein the inversion determination unit generates the inversion control signal when the external clock signal transitions between the leading edge of the internal clock signal and a defined point between the leading and trailing edges of the internal clock signal.

9. The DLL of claim 8, wherein the defined point between the leading and trailing edges of the internal clock signal is generated by delaying a start signal.

10. The DLL of claim 9, wherein the inversion determination unit comprises:
a first latch circuit configured to latch the external clock signal on the leading edge of the internal clock signal to output a level detection signal;
a second latch circuit configured to latch the level detection signal on the leading edge of the start signal to output a first inversion decision signal; and
a third latch circuit configured to latch the level detection signal on the leading edge of a reproduction clock signal to output a second inversion decision signal, wherein the reproduction clock signal is generated by a logical AND operation between the internal clock and the delayed start signal,
wherein the inversion control signal is generated by a logical AND operation between the first inversion decision signal and the second inversion decision signal.

11. An integrated circuit (IC), comprising:
an internal circuit responsive to an internal clock signal; and
a delay-locked loop (DLL) receiving an external clock signal and generating the internal clock signal in relation to the external clock signal, wherein the DLL comprises:
a phase detector configured to detect a phase difference between the external clock signal and the internal clock signal;
a variable delay line configured to variably delay the external clock signal in relation to the phase difference to generate an intermediate clock signal;
a selection unit configured to select between the intermediate clock signal and an inverted version of the intermediate clock signal in relation to an inversion control signal, and to generate an internal clock signal according to the selection; and
an inversion determination unit configured to generate the inversion control signal in relation to transition of the external clock signal within a duty error margin.

12. The IC of claim 11, wherein the duty error margin corresponds to a specific range of the internal clock signal.

13. The IC of claim 12, wherein the specific range corresponds to a range between the leading edge of the internal clock signal and the leading edge of a delayed version of the internal clock signal.

14. The IC of claim 12, wherein the specific range corresponds to a range between the leading edge of the internal clock signal and a defined point between the leading edge and the trailing edge of the internal clock signal.

15. The IC of claim 14, wherein the defined point between the leading and trailing edges of the internal clock signal is generated by delaying a start signal.

16. The IC of claim 11, wherein the inversion determination unit delays the internal clock signal by a predetermined time and generates the inversion control signal when the external clock signal transitions between the leading edge of the internal clock signal and the leading edge of the delayed internal clock signal.

17. The IC of claim 16, wherein the inversion determination unit comprises:
a first latch circuit configured to latch the external clock signal on the leading edge of the internal clock signal to output a first level detection signal;
a second latch circuit configured to latch the external clock signal on the leading edge of a delayed internal clock signal to output a second level detection signal; and
a third latch circuit configured to latch an inversion decision signal on the leading edge of a start signal to output the inversion control signal, wherein the inversion decision signal is generated by a logical AND operation between the first level detection signal and the second level detection signal.

18. The IC of claim 11, wherein the inversion determination unit generates the inversion control signal when the external clock signal transitions between the leading edge of the internal clock signal and a defined point between the leading and trailing edges of the internal clock signal.

19. The IC of claim 18, wherein the defined point between the leading and trailing edges of the internal clock signal is generated by delaying a start signal.

20. The IC of claim 19, wherein the inversion determination unit comprises:
a first latch circuit configured to latch the external clock signal on the leading edge of the internal clock signal to output a level detection signal;
a second latch circuit configured to latch the level detection signal on the leading edge of the start signal to output a first inversion decision signal; and
a third latch circuit configured to latch the level detection signal on the leading edge of a reproduction clock signal to output a second inversion decision signal, wherein the reproduction clock signal is generated by a logical AND operation between the internal clock and the delayed start signal,
wherein the inversion control signal is generated by a logical AND operation between the first inversion decision signal and the second inversion decision signal.

* * * * *